United States Patent
Aljohani et al.

(10) Patent No.: US 11,223,432 B1
(45) Date of Patent: Jan. 11, 2022

(54) SYSTEM AND METHOD FOR DETERMINING UNKNOWN RADIO FREQUENCIES

(71) Applicant: King Abdulaziz University, Jeddah (SA)

(72) Inventors: Abdulah Jeza Aljohani, Jeddah (SA); Salman Ghafoor, Jeddah (SA); Ammar Khalid, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 17/397,149

(22) Filed: Aug. 9, 2021

(51) Int. Cl.
*H04B 17/30* (2015.01)

(52) U.S. Cl.
CPC ................... *H04B 17/30* (2015.01)

(58) Field of Classification Search
CPC ............. H04B 17/30; H04B 10/2507
See application file for complete search history.

(56) References Cited

U.S. PATENT DOCUMENTS

| | | | | |
|---|---|---|---|---|
| 8,897,607 | B2 * | 11/2014 | DeSalvo | H04B 10/2575 385/2 |
| 2007/0292142 | A1 | 12/2007 | Hashimoto et al. | |
| 2012/0002972 | A1 | 1/2012 | Stiffler et al. | |
| 2017/0026126 | A1 * | 1/2017 | Kpodzo | H04B 1/109 |
| 2019/0212377 | A1 * | 7/2019 | Song | G01R 23/17 |

FOREIGN PATENT DOCUMENTS

| | | |
|---|---|---|
| CN | 111323649 A | 6/2020 |
| CN | 110632388 B | 10/2020 |
| CN | 110927448 B | 11/2020 |

OTHER PUBLICATIONS

Xuankun Lu et al, Wideband and Ambiguous-Free RF Channelizer Assisted Jointly by Spacing and Profile of Optical Frequency Comb, Jun. 2020, IEEE Photonics Journal, vol. 12, No. 3, pp. 1-11.*
Amol Choudhary, et al., "Tailoring of the Brillouin gain for on-chip widely tunable and reconfigurable broadband microwave photonic filters", Optics Letters, vol. 41, No. 3, Feb. 1, 2016, pp. 436-439.
Ammar Khalid, et al., "A novel wideband radio frequency measurement based on photonic signal processing", Microwave and Optical Technology Letters, vol. 63, Issue 4, 2020, pp. 1152-1159.

* cited by examiner

*Primary Examiner* — Jean B Corrielus
(74) *Attorney, Agent, or Firm* — Oblon, McClelland, Maier & Neustadt, L.L.P.

(57) ABSTRACT

An apparatus for determining unknown radio frequencies is described. The apparatus modulates a first optical signal from tunable optical source with RF signal that includes unknown center frequency value to generate modulated optical signal. The apparatus combines modulated optical signal with second optical signal to generate combined modulated optical signal. The apparatus receives output electrical signal from photodetector in response to receiving combined modulated optical signal at photodetector, splits output electrical signal into first output electrical signal and second output electrical signal, and filter first output electrical signal by applying first optical bandpass filter centered to generate first filtered RF signal. The apparatus tunes tunable optical source to first beat frequency value to determine unknown frequency value of RF signal.

19 Claims, 11 Drawing Sheets

SYSTEM AND METHOD FOR DETERMINING UNKNOWN RADIO FREQUENCIES

BACKGROUND

Field of the Invention

The present disclosure is related to systems and methods for determining unknown radio frequencies and, more particularly, to systems and methods for determining unknown radio frequencies using photonic signal processing.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Frequency measurement is on high demand for modern high speed communications, radars, and electronic warfare systems. Frequency measurement techniques may be classified into three techniques based on their principle of operation such as a frequency to time mapping technique, a frequency to space mapping technique, and a frequency to power mapping technique. However, these techniques may involve significant signal processing and complex dispersive and delay components that may make the process of frequency measurement complicated and cost-inefficient.

Silicon-based integrated microwave frequency measuring instrument is described in Chinese Patent No. CN110927448B, "Silicon-based integrated microwave frequency measuring instrument", incorporated herein by reference in its entirety. According to the '448 patent, a continuous laser is generated by an off-chip light source and is introduced into a chip. Further, a radio frequency signal to be measured loaded by a double parallel Mach-Zehnder modulator on the chip is provided by an off-chip radio frequency source. Also, an electric signal generated by an on-chip photoelectric detector is connected with an off-chip oscilloscope and is sent to a data processing system for processing to obtain a measurement result.

An apparatus and a method are described for producing extended bandwidth single-sideband suppressed carrier optical waveforms in U.S. Patent Application No. US 2012/0002972 A1, "Techniques for Single Sideband Suppressed Carrier (SSBSC) Optical Signals that Scale to Bandwidths over 20 Gigahertz", incorporated herein by reference in its entirety. The '972 patent application describes a method and an apparatus to generate a wideband optical waveform, such as a chirp, that is a single order sideband with a suppressed carrier (SSBSC). The patent application further describes a method including modulating a radio frequency (RF) or microwave signal or waveform onto an optical carrier and optically filtering the output of the modulation to achieve the SSBSC optical waveform.

A device and a method for generating a carrier residual signal are described in U.S. Patent Application No. US 2007/0292142 A1, "Method for Generating Carrier Residual Signal and Its Device", incorporated herein by reference in its entirety.

A microwave photon broadband spectrum measuring method and device are described in Chinese Patent Application No. CN111323649A, "Microwave photon broadband spectrum measuring method and device", incorporated herein by reference in its entirety. The '649 patent application describes a microwave photonic broadband spectrum measuring method. Further, the patent application describes a microwave photon frequency multiplication unit for linear frequency modulation signal for modulating the light carrier processing and generating two paths of primary modulated light signals.

None of the systems and methods described above have the capability to determine unknown radio frequencies in an efficient and cost-effective manner.

SUMMARY

In an exemplary embodiment, a method of determining unknown radio frequencies using photonic signal processing is described. The method includes modulating a first optical signal from a tunable optical source with a radio frequency (RF) signal that includes an unknown center frequency value by applying an optical single sideband modulation with carrier suppression (SSB-SC) to generate a modulated optical signal, combining the modulated optical signal with a second optical signal having a first optical frequency centered at a first frequency value from a first optical source and a third optical signal having a second optical frequency centered at a second frequency value from a second optical source to generate a combined modulated optical signal, receiving an output electrical signal as an output from a photodetector in response to receiving the combined modulated optical signal as an input at the photodetector, splitting the output electrical signal equally into a first output electrical signal and a second output electrical signal, filtering the first output electrical signal by applying a first optical bandpass filter centered at a third frequency value to generate a first filtered RF signal, tuning the tunable optical source to a first beat frequency value at which a first power magnitude value associated with the first filtered RF signal exceeds a threshold value, and determining the unknown center frequency value associated with the RF signal based at least on the first beat frequency value.

In another exemplary embodiment, an apparatus for determining unknown radio frequencies using photonic signal processing is described. The apparatus is configured to modulate a first optical signal from a tunable optical source with a radio frequency (RF) signal that includes an unknown center frequency value by applying an optical single sideband modulation with carrier suppression (SSB-SC) to generate a modulated optical signal, combine the modulated optical signal having a second optical signal with a first optical frequency centered at a first frequency value from a first optical source and a third optical signal having a second optical frequency centered at a second frequency value from a second optical source to generate a combined modulated optical signal, receive an output electrical signal as an output from a photodetector in response to receiving the combined modulated optical signal as an input at the photodetector, split the output electrical signal equally into a first output electrical signal and a second output electrical signal, filter the first output electrical signal by applying a first optical bandpass filter centered at a third frequency value to generate a first filtered RF signal, tune the tunable optical source to a first beat frequency value at which a first power magnitude value associated with the first filtered RF signal exceeds a threshold value, and determine the unknown center frequency value associated with the RF signal based at least on the first beat frequency value.

The foregoing general description of the illustrative aspect of the present disclosures and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
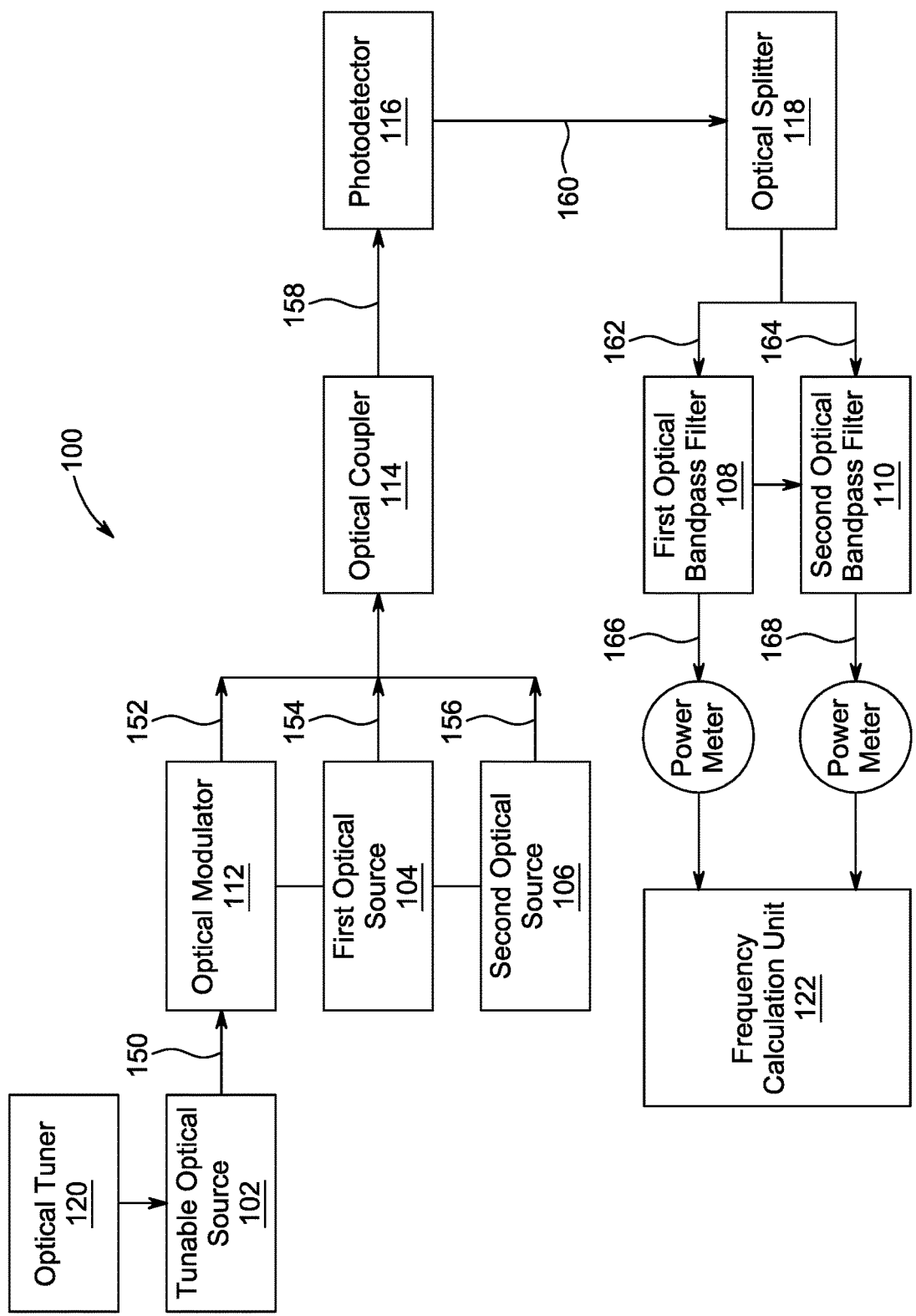
FIG. 1 is a block diagram of an apparatus for determining unknown radio frequencies using photonic signal processing, according to exemplary aspects of the present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values there between.

Aspects of the present disclosure are directed to systems and methods for determining a wide range of unknown radio frequencies using photonic signal processing.

Referring to FIG. 1, a block diagram of an apparatus 100 for determining unknown radio frequencies using photonic signal processing is illustrated. According to exemplary aspects of the present disclosure, the apparatus 100 may include a tunable optical source 102, a first optical source 104, a second optical source 106, a first optical bandpass filter 108, a second optical bandpass filter 110, an optical modulator 112, an optical coupler 114, a photodetector 116, an optical splitter 118, an optical tuner 120, and a frequency calculation unit 122.

According to an example, the tunable optical source 102 may be a tunable laser source whose wavelength of operation can be altered in a controlled manner. Accordingly, the tunable optical source 102 may have a tunable center frequency. Further, in a non-limiting example, the tunable optical source 102 may have an output power in a range of 10 MHz to 20 MHz, preferably 12-15 MHz. The first optical source 104 and the second optical source 106 may be laser sources having fixed center frequencies and may have optical powers of 5 GHz and 12 GHz, respectively. In an example, the tunable optical source 102 may be a dye laser, a diode laser, or a free electron laser.

Further, in an example, the first optical bandpass filter 108 and the second optical bandpass filter 110 may allow only a predefined wavelength band and block others. In an example, the first optical bandpass filter 108 and the second optical bandpass filter 110 may allow the wavelengths below 200 nm and above 3000 nm preferably allow 500-800 nm and/or 3500-4000 nm, and preferably block 1000-1500 nm. The first optical bandpass filter 108 and the second optical bandpass filter 110 may have a bandwidth of 0.5 GHz and may be centered at 5 GHz and 10 GHz, respectively. The optical modulator 112 is a device that is configured to modulate the tunable optical source 102. In an example, the optical modulator 112 may be a dual-drive Mach-Zehnder modulator (DD-MZM) or a single-drive MZM (SD-MZM). Although it has been described that the apparatus 100 includes a single optical modulator 112 (i.e., optical modulator 112), in some embodiments, the apparatus 100 may include more than one optical modulator 112.

The optical coupler 114 may be a device that combines two or more input signals into one single output signal, and the optical splitter 118 may be a device that splits an input signal into two or more outputs signals. The photodetector 116 may be a sensor or a set of sensors configured to detect light or electromagnetic radiation. In a non-limiting example, the photodetector 116 may have a responsivity (R) in a range to 0.2 A/W to 1 A/W and a bandwidth in a range of 15 GHz to 25 GHz. For example, the photodetector may have R of 0.9 A/W and a bandwidth of 20 GHz, preferably an R of 0.8 to 0.95 A/W and a bandwidth of 18-19.5 GHz.

According to an aspect of the present disclosure, the optical modulator 112 may be configured to modulate the tunable optical source 102. In an aspect, the optical modulator 112 may be configured to modulate a first optical signal 150 from the tunable optical source 102 with a radio frequency (RF) signal. In an example, the optical modulator 112 may apply an optical single sideband modulation with carrier suppression (SSB-SC) on the tunable optical source 102 to modulate the first optical signal 150. As a result, the optical modulator 112 may generate a modulated optical signal 152. In an example, the RF signal may be an unknown RF signal that may include an unknown center frequency value that has to be detected. In an example, center frequency value of the first optical signal 150 may be denoted by "$f_T$" and the unknown center frequency value of the RF signal may be denoted by "$f_U$". Further, the modulated optical signal 152 is centered at $f_T+f_U$.

According to an aspect, the optical coupler 114 may be configured to combine the modulated optical signal 152 with a second optical signal 154 from the first optical source 104, and a third optical signal 156 from the second optical source 106 to generate a combined modulated optical signal 158. In an aspect, the second optical signal 154 may have a first optical frequency centered at a first frequency value, and the third optical signal 156 may have a second optical frequency centered at a second frequency value. In one example implementation, the first frequency value may be 193.1 THz, and the second frequency value may be 193.115 THz, although any other frequency value may also be included. According to an example, the first frequency value may be denoted by "$f_{LP}$" and the second frequency value may be denoted by "$G_{HP}$". In an example, "$f_{LP}$" may be 15 GHz lower than "$f_{HP}$". In an aspect of the present disclosure, optical power of the first optical source 104 centered at "$f_{LP}$" may be lower than optical power of the second optical source 106 centered at "$f_{HP}$". In an example, the combined modulated optical signal 158 may be composed of the frequencies $f_{LP}$, $f_{HP}$, and $f_T+f_U$.

In an aspect, the photodetector 116 may be configured to receive the combined modulated optical signal 158 as an input. Upon receiving the combined modulated optical signal 158, the photodetector 116 may process the combined modulated optical signal 158 and generate an output electrical signal 160. In an example, the photodetector 116 may perform a heterodyne detection on the combined modulated optical signal 158 by, for example, detecting superimposed combined modulated optical signal 158 with a square-law photodetector. In an example, heterodyne detection is a method of extracting information encoded as modulation of phase, frequency or both of electromagnetic radiation in the wavelength band of visible or infrared light. The light signal is compared with standard or reference light from a local oscillator (LO) that would have a fixed offset in frequency and phase from the signal if the latter carried null information. Heterodyne detection is usually performed as interferometry where the LO and signal share a common origin. According to an aspect, the generated output electrical signal 160 may be composed of multiple beat frequencies due to heterodyne detection (as described with respect to equations (1), (2), and (3), provided below).

In an example, a wavelength division multiplexed (WDM) signal may be composed of two electrical fields, namely a first electric field (denoted by "$E_1(t)$") and a second electric field (denoted by "$E_2(t)$") as described in equations (1) and (2), respectively, provided below:

$$E_1(t) = E_{01} e^{j(2\pi f_1 t + \varnothing_1)} u \quad (1)$$

$$E_2(t) = E_{02} e^{j(2\pi f_2 t + \varnothing_2)} u \quad (2)$$

In equations (1) and (2), $E_{01}$ and $E_{02}$ represent electric fields amplitudes, $f_1$ and $f_2$ represent optical frequencies, $\varnothing_1$ and $\varnothing_2$ represent the phase of the time varying electrical fields, and u represents the unit vector in the direction of the electric fields.

The resulting current at the output of the photodetector 116 having responsivity R is given by equation (3) provided below.

$$I_{pd} = R E_{01} E_{02} \cos((f_2 - f_1) t + (\varnothing_2 - \varnothing_1)) \quad (3)$$

Based on equation (3), the output electrical signal 160 generated by the photodetector 116 as an output may be composed of signals centered at $(f_T+f_U)-f_T+f_{LP}$, $f_{HP}-(f_T+f_U)$ and $f_{HP}-f_{LP}$.

The optical splitter 118 may be configured to split the output electrical signal 160 into two signals, namely a first output electrical signal 162 and a second output electrical signal 164. In an example, the first output electrical signal 162 and the second output electrical signal 164 may be split in equal ratio or in some other ratio. In an aspect, the first output electrical signal 162 is provided as an input to the first optical bandpass filter 108 and the second output electrical signal 164 is provided as an input to the second optical bandpass filter 110.

In an example, the first optical bandpass filter 108 may be centered at a third frequency value, and the second optical bandpass filter 110 may be centered at a fourth frequency value. In an example, the third frequency value may be 5 GHz, and the fourth frequency value may be 10 GHz. The first optical bandpass filter 108 may filter the first output electrical signal 162 to generate a first filtered RF signal 166. The second optical bandpass filter 110 may filter the second output electrical signal 164 to generate a second filtered RF signal 168. According to an aspect of the present disclosure, the power of the first filtered RF signal 166 and the second filtered RF signal 168 may be observed using power meters. In an example, the power of the first filtered RF signal 166 may be 10 dBm and the power of the second filtered RF signal 168 may be 12 dBm.

The optical tuner 120 may be configured to tune the tunable optical source 102 to a first beat frequency value at which a first power magnitude value associated with the first filtered RF signal 166 exceeds a threshold value. In an example, the first beat frequency value may be 5 GHz at which the first power magnitude value associated with the first filtered RF signal 166 may be 10 dBm and the threshold value may be 5 dBm. According to an aspect of the present disclosure, the frequency calculation unit 122 may be configured to determine the unknown center frequency value associated with the RF signal based at least on either the first beat frequency value or the third frequency value.

In some aspects, the optical tuner 120 may further be configured to tune the tunable optical source 102 to a second beat frequency value at which a second power magnitude value associated with the second filtered RF signal 168 exceeds another threshold value. In an example, the second beat frequency value may be 10 GHz at which the second power magnitude value associated with the second filtered RF signal 168 may be 12 dBm and the another threshold value may be 15 dBm. According to an aspect of the present disclosure, the frequency calculation unit 122 may be configured to determine the unknown center frequency value associated with the RF signal based at least on either the second beat frequency value or the fourth frequency value. Accordingly, powers of the first filtered RF signal 166 and the second filtered RF signal 168 that are centered at 5 GHz and 10 GHz are measured while tuning the center frequency $f_T$ of the tunable optical source 102.

According to an aspect, the first power magnitude value associated with the first filtered RF signal 166 exceeds the threshold value when an upper side band of the first filtered RF signal 166 is at a first predetermined frequency difference value from the first frequency value and at a second predetermined frequency difference value from the second frequency value. In an example, the first predetermined frequency difference value is 5 GHz, and the second predetermined frequency difference value is 10 GHz.

In an aspect, the second power magnitude value associated with the second filtered RF signal 168 exceeds another threshold value when an upper side band of the first filtered RF signal 166 is at a first predetermined frequency difference value from the first frequency value and at a second predetermined frequency difference value from the second frequency value. In an example, the first predetermined frequency difference value may be 10 GHz, and the second predetermined frequency difference value may be 5 GHz.

Figure 2B:
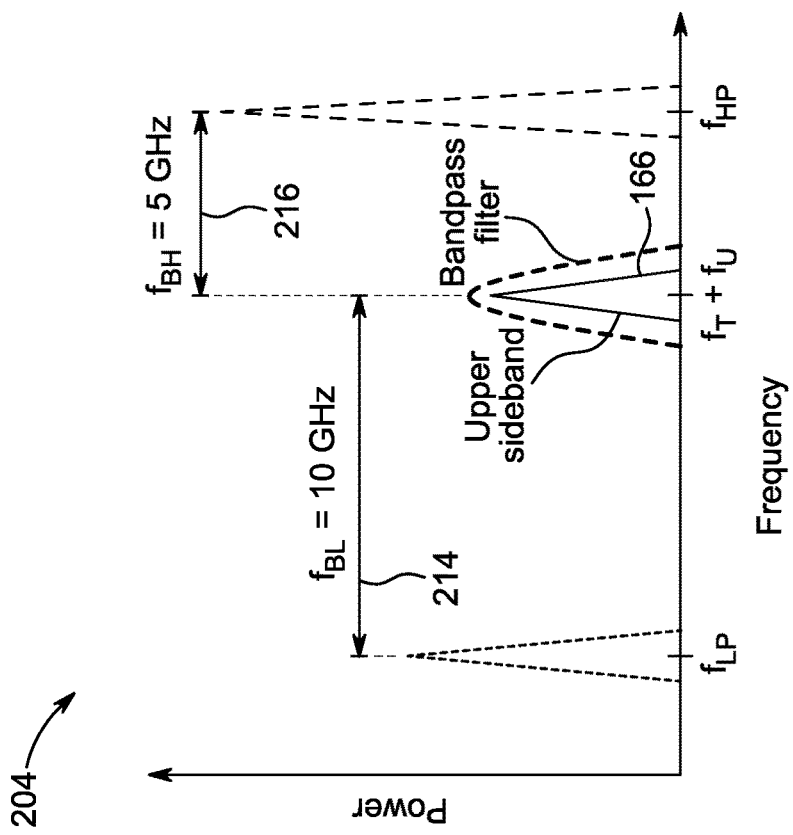
FIG. 2B shows a spectral plot of the first filtered RF signal, with a first beat frequency value $f_{BL}$=10 GHz and a second beat frequency value $f_{BH}$=5 GHz, according to exemplary aspects of the present disclosure.
Figure 2A:
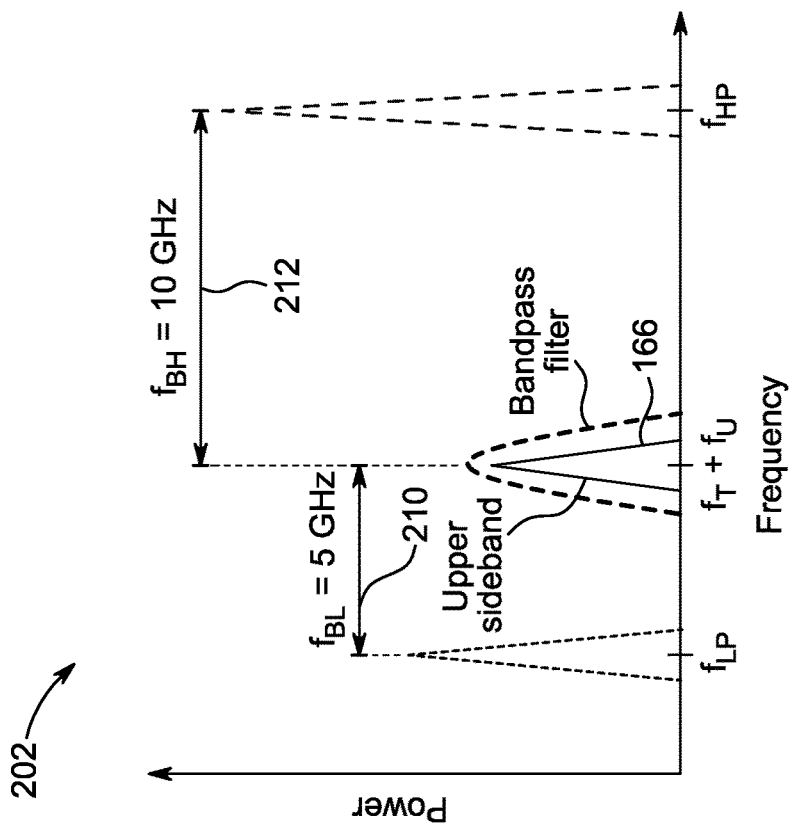
FIG. 2A shows a spectral plot of a first filtered RF signal, with a first beat frequency value $f_{BL}$=5 GHz and a second beat frequency value $f_{BH}$=10 GHz, according to exemplary aspects of the present disclosure.

FIG. 2A shows a spectral plot 202 of the first filtered RF signal 166, with a first beat frequency value $f_{BL}$=5 GHz and a second beat frequency value $f_{BH}$=10 GHz, according to exemplary aspects of the present disclosure.

According to an aspect, as shown in FIG. 2A, when the upper side band of the first filtered RF signal 166 is at the first predetermined frequency difference value of 5 GHz from the first frequency value $f_{LP}$ (represented by '210') and at the second predetermined frequency difference value of 10 GHz from the second frequency value $f_{HP}$ (represented by '212'), the power meters may record a significant power due to the generation of beat frequencies at the output of the photodetector 116.

FIG. 2B shows a spectral plot 204 of the first filtered RF signal 166, with a first beat frequency value $f_{BL}$=10 GHz and a second beat frequency value $f_{BH}$=5 GHz, according to exemplary aspects of the present disclosure.

According to an aspect, as shown in FIG. 2A, when the upper side band of the first filtered RF signal 166 is at the first predetermined frequency difference value of 10 GHz from the first frequency value $f_{LP}$ (represented by '214') and at the second predetermined frequency difference value of 5 GHz from the second frequency value $f_{HP}$ (represented by '216'), the power meters may record a significant power due to the generation of beat frequencies at the output of the photodetector 116.

According to an aspect of the present disclosure, when any of the two conditions as shown in FIGS. 2A and 2B are met, the frequency of the unknown RF signal may be calculated using any of equation (4) and equation (5) provided below.

$$f_u = f_{LP} - f_T + f_{BL} \quad (4)$$

$$f_u = f_{HP} - f_T - f_{BH} \quad (5)$$

In the above equations (4) and (5), $f_{BL}$ represent the first beat frequency value and $f_{BH}$ represent the second beat frequency value.

As illustrated in FIG. 2A, tuning the center frequency $f_T$ of the tunable optical source 102 that is modulated by the unknown frequency $f_U$ generates beats of 5 GHz after photodetection. Further, as illustrated in FIG. 2B, tuning the center frequency $f_T$ of the tunable optical source 102 that is modulated by the unknown frequency $f_U$ generates beats of 10 GHz after photodetection. The power of each of these frequency beats may depend upon frequency separation of the single sideband from the fixed frequency of $f_{LP}$=193.1 THz and $f_{HP}$=193.115 THz.

Figure 3:
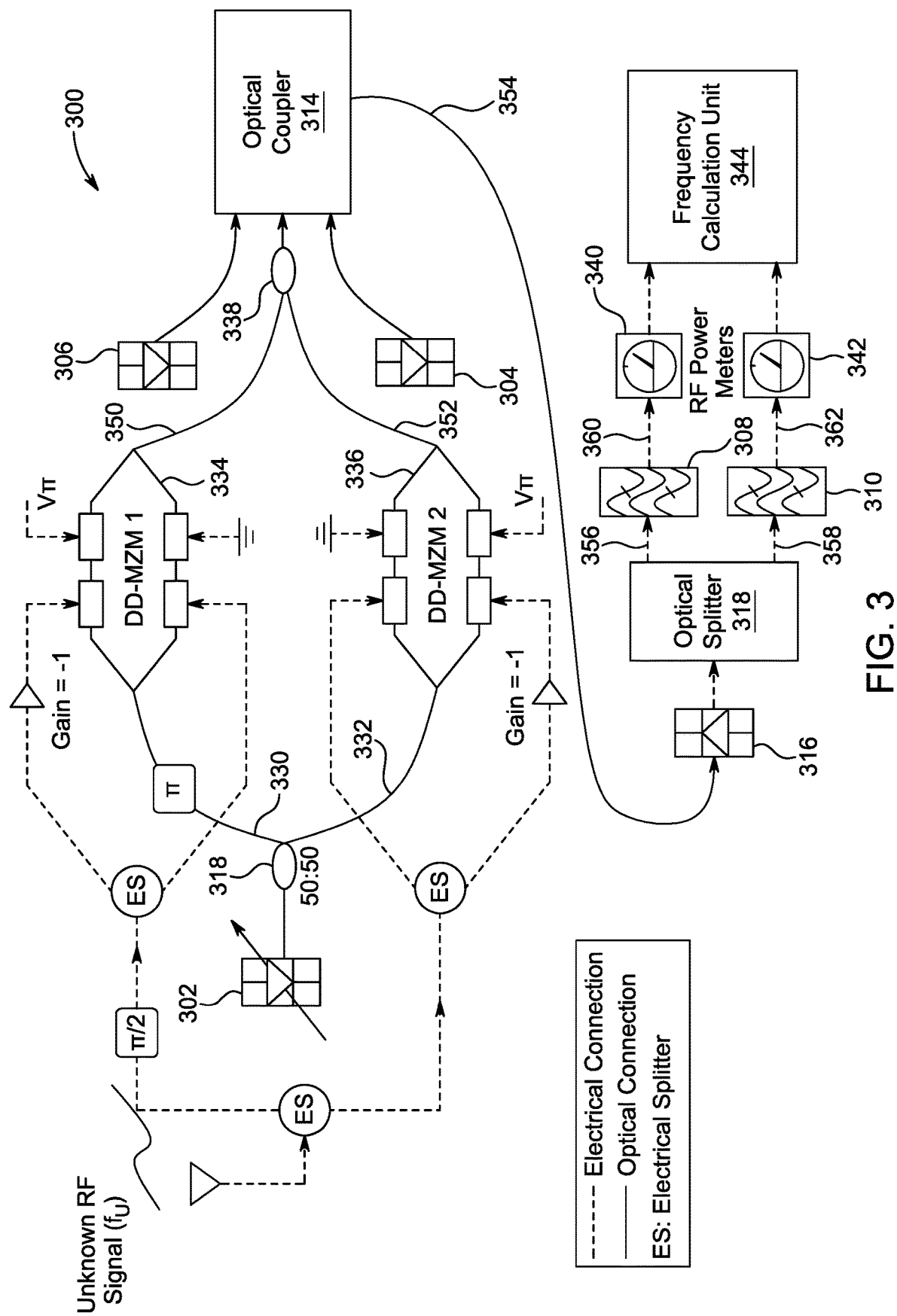
FIG. 3 shows a schematic diagram of the apparatus for determining unknown radio frequencies using photonic signal processing, according to exemplary aspects of the present disclosure.

FIG. 3 shows a schematic diagram of the apparatus 300 for determining unknown radio frequencies using photonic signal processing, according to exemplary aspects of the present disclosure.

As can be seen in FIG. 3, an unknown RF signal is used to modulate a tunable optical source 302 by employing SSB-SC modulation. According to an aspect of the present disclosure, the tunable optical source 302 has a linewidth of 10 MHz and is equally split into two paths, namely a first path 330 and a second path 332 using an optical splitter 318.

In an example, the first path 330 of the optical signal is phase shifted by 180 degrees and provided as input to a first dual-drive Mach-Zehnder modulator (DD-MZM) 334 (represented by DD-MZM 1 in FIG. 3). The second path 332 of the output signal is provided as input to a second DD-MZM 336 (represented by DD-MZM 2 in FIG. 3). According to an aspect of the present disclosure, the constant phase shift of 180 degrees is required to suppress a carrier that is obtained at outputs of the first DD-MZM 334 and the second DD-MZM 336. Although, the first path 330 of the optical signal is phase shifted by 180 degrees, any other amount of phase shift may also be included.

In an example, both the first DD-MZM 334 and the second DD-MZM 336 may have an extinction ratio of 50 dB and are biased at null-point to generate optical double sideband suppressed carrier (DSB-SC) signals 350, 352 at the output. Further, the optical signals applied at the terminals of the first DD-MZM 334 and the second DD-MZM 336 are shifted by 90 degrees with respect to each other.

Also, the two optical DSB-SC signals 350, 352 are combined through an optical cross-coupler 338, and an optical SSB-SC signal 354 is obtained at the output of an optical coupler 314. The optical SSB-SC signal 354 is coupled with a fixed frequency first optical source 304 centered at $f_{LP}$=193.1 THz and a fixed frequency second optical source 306 centered at $f_{HP}$=193.115 THz. The optical SSB-SC signal 354 is given as input to a photodetector 316, having a responsivity of 0.9 A/W and bandwidth of 20 GHz. The output of the photodetector 316 is composed of multiple electrical signals centered at the frequency difference of the optical signals received at the input. Thereafter, the output of the photodetector 316 is equally split in two signals, namely a first output electrical signal 356 and a second output electrical signal 358 using the optical splitter 318 and filtered using a first optical bandpass filter 308 and a second optical bandpass filter 310. The first optical bandpass filter 308 may filter the first output electrical signal 356 to generate a first filtered RF signal 360 and the second optical bandpass filter 310 may filter the second output electrical signal 358 to generate a second filtered RF signal 362. In an aspect of the present disclosure, the first filtered RF signal 360 is provided as an input to a first power meter 340 and the second filtered RF signal 362 is provided as an input to a second power meter 342 followed by a frequency calculation unit 344, as shown in FIG. 3.

According to an aspect of the present disclosure, the frequency calculation unit 344 calculates or determines the unknown center frequency value associated with the unknown RF signal using equation (4) or equation (5). In an example, the unknown center frequency value may be 1 GHz when the first beat frequency value is 5 GHz and the second beat frequency value is 10 GHz. In another example, the unknown center frequency value may be 60 GHz when the first beat frequency value is 10 GHz and the second beat frequency value is 5 GHz. Further, the frequency of the tunable optical source 302 is swept until significant signal power is detected at the output of the first optical bandpass filter 308 and the second optical bandpass filter 310. Once the signal power is detected, either equation (4) or equation (5) may be applied to calculate the frequency of the unknown RF signal depending upon the magnitude of power observed on the first power meter 340 and the second power meter 342.

EXAMPLES AND EXPERIMENTS

The following examples are provided to illustrate further and to facilitate the understanding of the present disclosure.

Experimental Data and Analysis

In an experiment, the apparatus 300 was tested for various radio frequencies ranging from a few MHz up to 60 GHz and beyond. It was observed that the apparatus 300 worked for any frequency as long as the optical SSB-SC signal 354 is generated with strong carrier and sideband suppression. For discussion in this document, two frequencies of 1 GHz and 60 GHz are considered from amongst a wide range of possible frequencies.

Figure 4A:
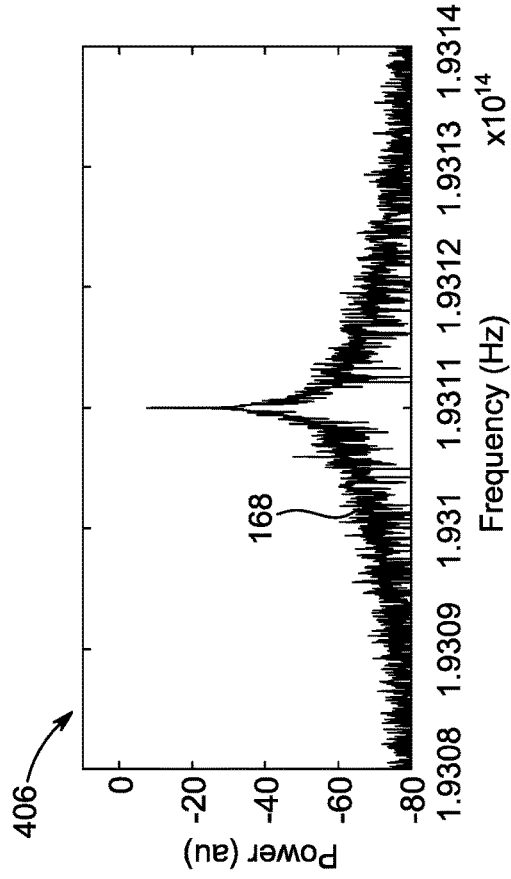
FIGS. 4A and 4B show spectral plots of the first filtered RF signal, according to exemplary aspects of the present disclosure.
Figure 4B:
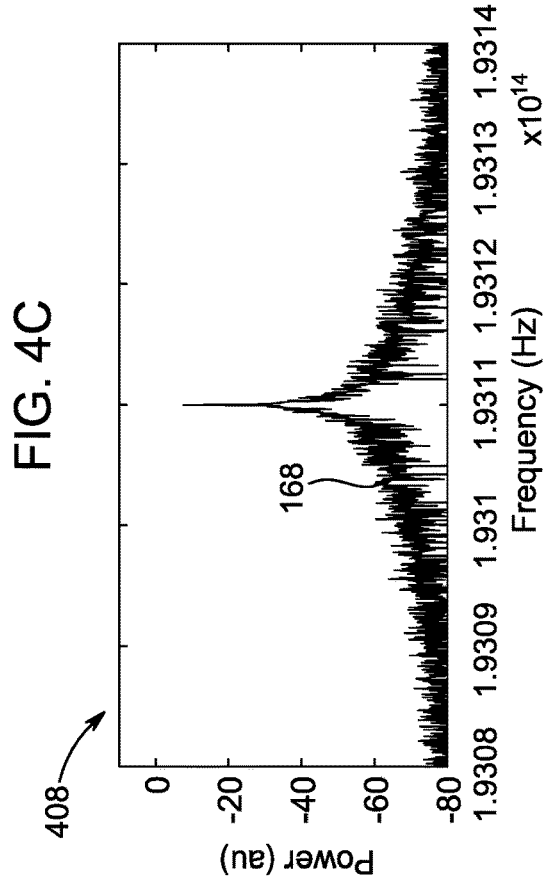

FIGS. 4A and 4B show spectral plots of the first filtered RF signal 166, according to exemplary aspects of the present disclosure. FIG. 4A shows a spectral plot 402 of the first filtered RF signal 166 when an upper side band of the first filtered RF signal 166 is at the first predetermined frequency difference value of 5 GHz from the first frequency value while the modulating signal has a frequency of 1 GHz. FIG. 4B shows a spectral plot 404 of the first filtered RF signal 166 when an upper side band of the first filtered RF signal 166 is at the second predetermined frequency difference value of 10 GHz from the second frequency value while the modulating signal has a frequency of 60 GHz.

Figure 4C:
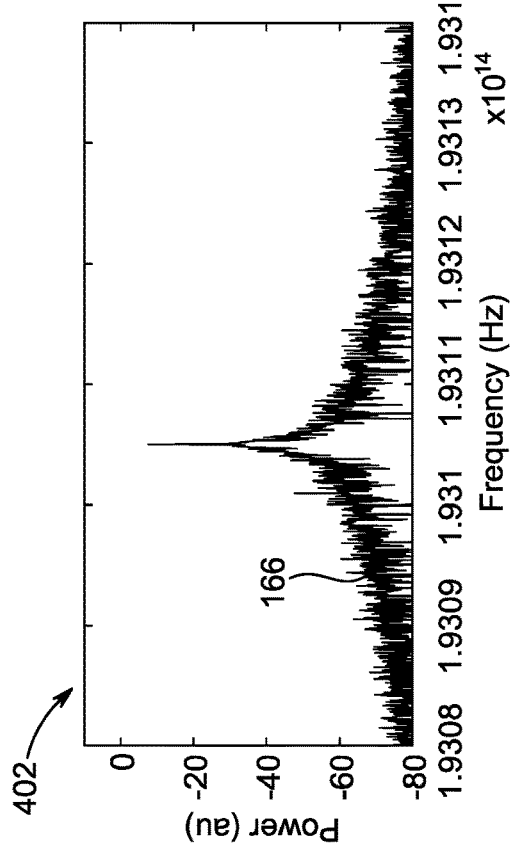
FIGS. 4C and 4D show spectral plots of a second filtered RF signal, according to exemplary aspects of the present disclosure.
Figure 4D:
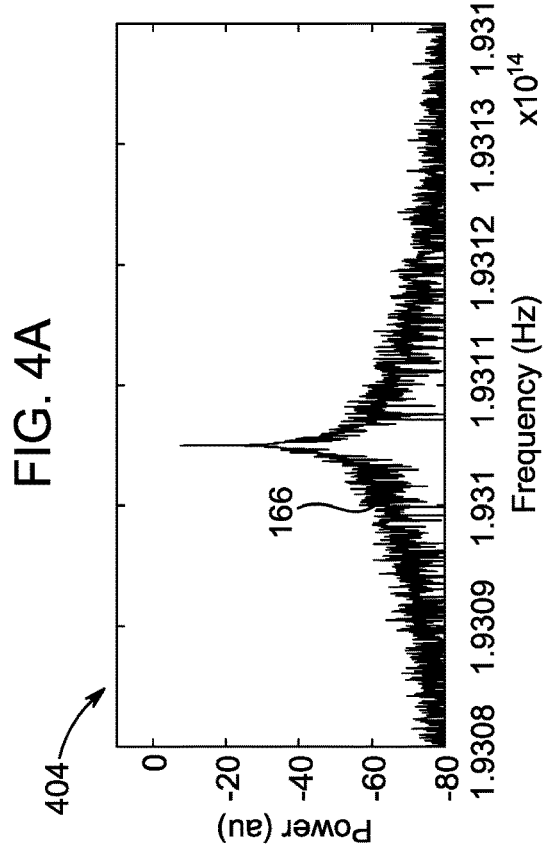

FIGS. 4C and 4D show spectral plots of the second filtered RF signal 168, according to exemplary aspects of the present disclosure. FIG. 4C shows a spectral plot 406 for the second filtered RF signal 168 when an upper side band of the first filtered RF signal 166 is at the first predetermined frequency difference value of 10 GHz from the first frequency value while the modulating signal has a frequency of 1 GHz. FIG. 4D shows a spectral plot 408 for the second filtered RF signal 168 when an upper side band of the first filtered RF signal 166 is at the second predetermined frequency difference value of 5 GHz from the second frequency value, while the modulating signal has a frequency of 60 GHz. It may be observed from FIGS. 4A, 4B, 4C, and 4D that the carrier and sidebands are strongly suppressed for both modulating signals of 1 GHz and 60 GHz.

Figure 5A:
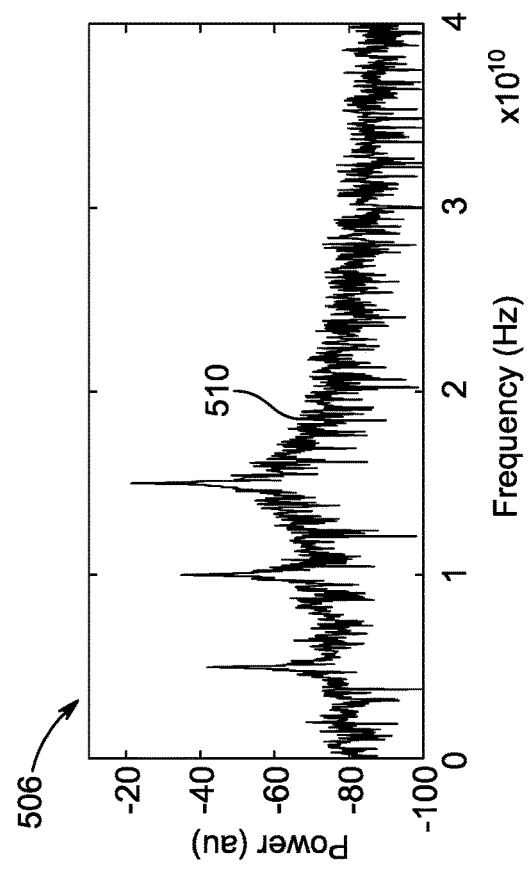
FIGS. 5A, 5B, 5C, and 5D show spectral plots of optical signals at a photodetector, according to exemplary aspects of the present disclosure.
Figure 5B:
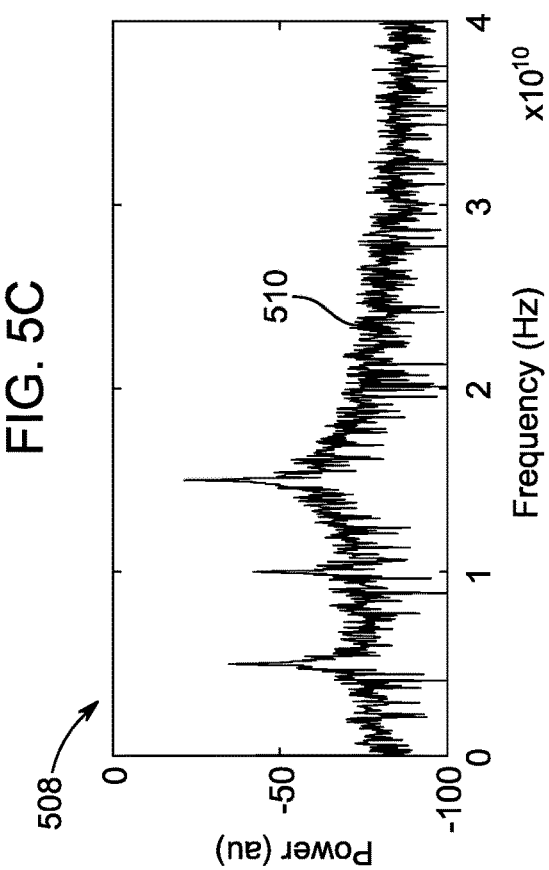
Figure 5C:
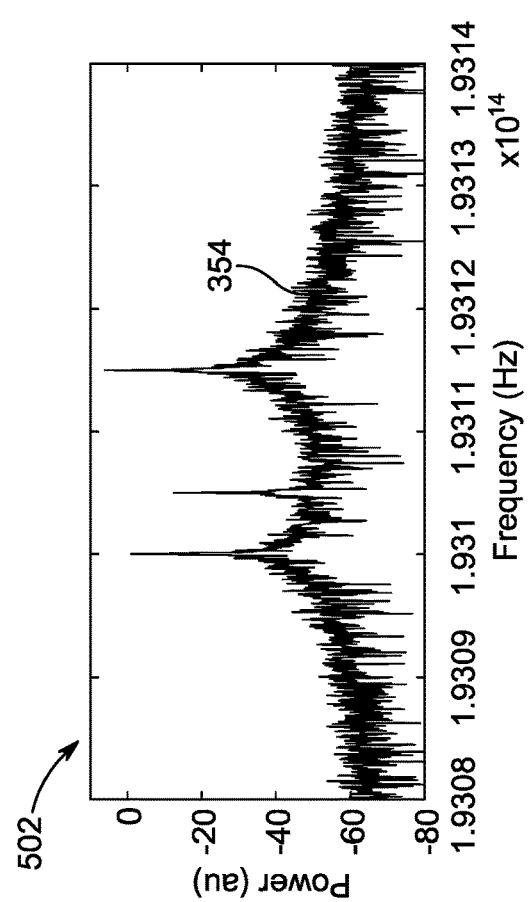

FIGS. 5A, 5B, 5C, and 5D show spectral plots of optical signals at the photodetector 316, according to exemplary aspects of the present disclosure. FIGS. 5A and 5B show spectral plots 502 and 504, respectively, of the optical SSB-SC signal 354 at the input of the photodetector 316 for the unknown RF signal of frequency 1 GHz. FIG. 5C shows a spectral plot 506 of an optical signal 510 at the output of the photodetector 316 for the unknown RF signal of frequency 1 GHz. It may be observed from FIG. 5B that the third frequency value (i.e., the low power beat) $f_{BL}$ has a frequency of 5 GHz and the fourth frequency value (i.e., the high power beat) $f_{BH}$ has a frequency of 10 GHz. These values of beat frequencies are obtained when the tunable optical source 102 has a frequency of $f_T$=193.104 THz. The same beat frequencies are once again observed by further tuning the $f_T$ to a value of 193.109 THz, as shown in FIG. 5B. Further, in FIG. 5C, it is shown the 10 GHz signal has higher power relative to the 5 GHz signal. Also, the first filtered RF signal 360 obtained at the output of the first optical bandpass filter 308 has a higher power relative to the second filtered RF signal 362 obtained at the output of the second optical bandpass filter 310, while tuning the tunable optical source 102.

Figure 5D:
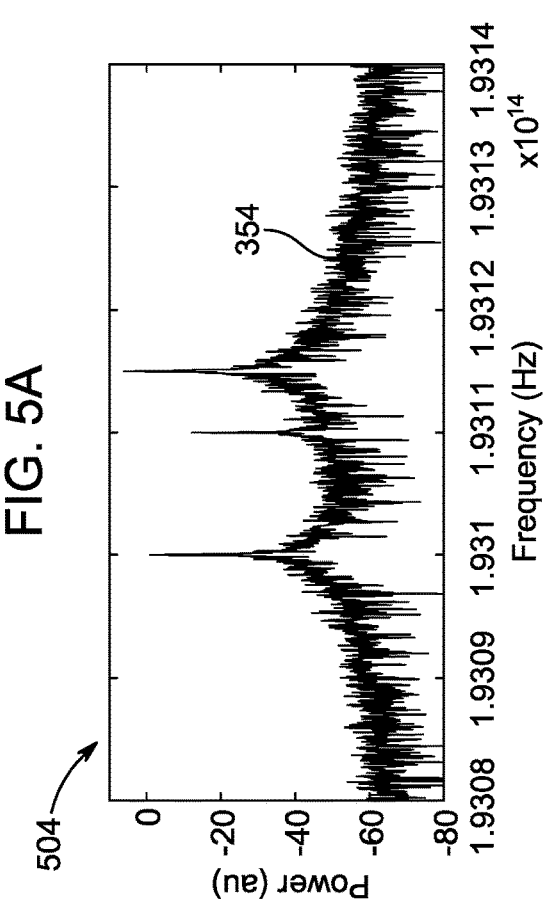

FIG. 5D shows a spectral plot 508 of the optical signal 510 at the output of the photodetector 316 for the unknown RF signal of frequency 1 GHz. It may be observed from FIG. 5D that the third frequency value (i.e., the low power beat) $f_{BL}$ and the fourth frequency value (i.e., the high power beat) $f_{BH}$ have changed positions. Therefore, when the first filtered RF signal 360 obtained at the output of the first optical bandpass filter 308 has a higher power relative to the second filtered RF signal 362 obtained at the output of the second optical bandpass filter 310 while tuning the tunable optical source 102. Further, in FIG. 5D, it is shown that the 5 GHz signal has higher power relative to the 10 GHz signal.

According to an aspect of the present disclosure, to determine the unknown center frequency $f_U$ through equations (4) and (5), only the relative power difference between the first filtered RF signal 360 and the second filtered RF signal 362 obtained at the output of the first optical bandpass filter 108 and the second optical bandpass filter 110, respectively, not the absolute powers. Both the equations (4) and (5) will give the same result for the unknown center frequency value $f_U$. A beat frequency of 15 GHz can also be observed in FIGS. 5C and 5D. This beat frequency results from the heterodyne detection of the two fixed frequency optical carriers $f_{LP}$=193:1 THz and $f_{HP}$=193:115 THz and is filtered out due to the first optical bandpass filter 308 and the second optical bandpass filter 310, as shown in FIG. 3. Although frequency separation of 15 GHz between $f_{LP}$ and $ft_{HP}$ is considered, any frequency spacing can be considered as long as the center frequencies of the first optical bandpass filter 308 and the second optical bandpass filter 310 are appropriately chosen.

Figure 6:
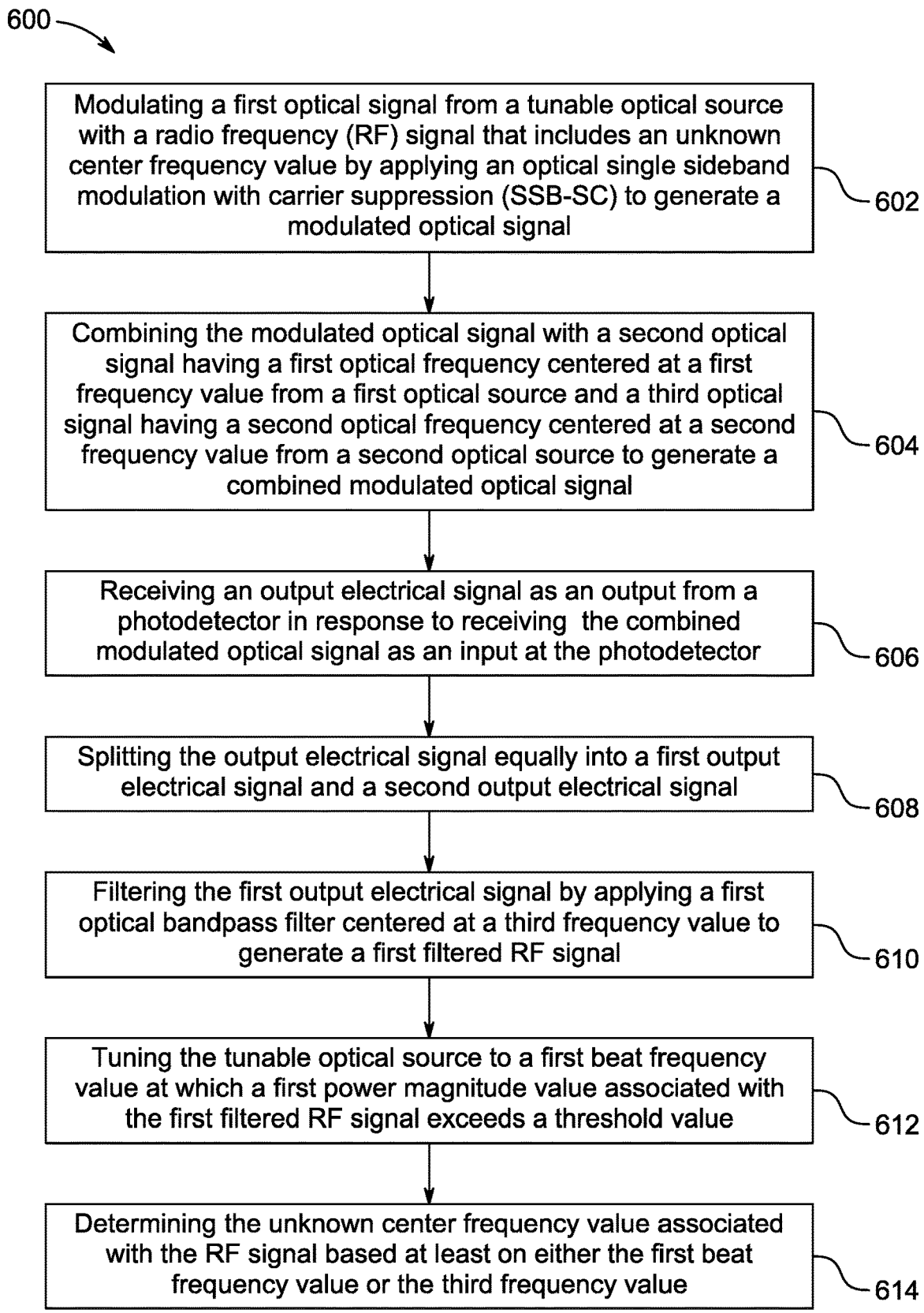
FIG. 6 illustrates a method of determining unknown radio frequencies using photonic signal processing, according to exemplary aspects of the present disclosure.

FIG. 6 illustrates a method 600 of determining unknown radio frequencies using photonic signal processing, according to exemplary aspects of the present disclosure.

At step 602, the method 600 includes modulating the first optical signal 150 from the tunable optical source 102 with RF signal that includes an unknown center frequency value by applying an optical single sideband modulation with carrier suppression (SSB-SC) to generate a modulated optical signal 152. According to an aspect of the present disclosure, the optical modulator 112 may be configured to modulate the first optical signal 150 from the tunable optical source 102 with the unknown RF signal.

At step 604, the method 600 includes combining the modulated optical signal 152 with a second optical signal 154 having a first optical frequency centered at a first frequency value from the first optical source 104 and a third optical signal 156 having a second optical frequency centered at a second frequency value from the second optical source 106 to generate a combined modulated optical signal 158. According to an aspect of the present disclosure, the optical coupler 114 may be configured to combine the modulated optical signal 152 with the second optical signal 154 and the third optical signal 156 to generate the combined modulated optical signal 158.

At step 606, the method 600 includes receiving an output electrical signal 160 as an output from the photodetector 116 in response to receiving the combined modulated optical signal 158 as an input at the photodetector 116. According to an aspect of the present disclosure, the photodetector 116 may be configured to receive the combined modulated optical signal 158 as an input. Upon receiving the combined modulated optical signal 158, the photodetector 116 may process the combined modulated optical signal 158 and generate an output electrical signal 160 as an output.

At step 608, the method 600 includes splitting the output electrical signal 160 equally into a first output electrical signal 162 and a second output electrical signal 164. According to an aspect of the present disclosure, the optical splitter 118 may be configured split the output electrical signal 160 equally into the first output electrical signal 162 and the second output electrical signal 164.

At step 610, the method 600 includes filtering the first output electrical signal 162 by applying the first optical bandpass filter 108 centered at a third frequency value to generate a first filtered RF signal 166. According to an aspect of the present disclosure, the first optical bandpass filter 108 may filter the first output electrical signal 162 to generate the first filtered RF signal 166.

At step 612, the method 600 includes tuning the tunable optical source 102 to a first beat frequency value at which a first power magnitude value associated with the first filtered RF signal 166 exceeds a threshold value. According to an aspect, the optical tuner 120 may be configured to tune the tunable optical source 102 to the first beat frequency value at which the first power magnitude value associated with the first filtered RF signal 166 exceeds the threshold value.

At step 614, the method 600 includes determining the unknown center frequency value associated with the RF signal based at least on either the first beat frequency value or the third frequency value. According to an aspect of the present disclosure, the frequency calculation unit 122 may be configured to determine the unknown center frequency value associated with the RF signal based at least on either the first beat frequency value or the third frequency value.

Figure 7:
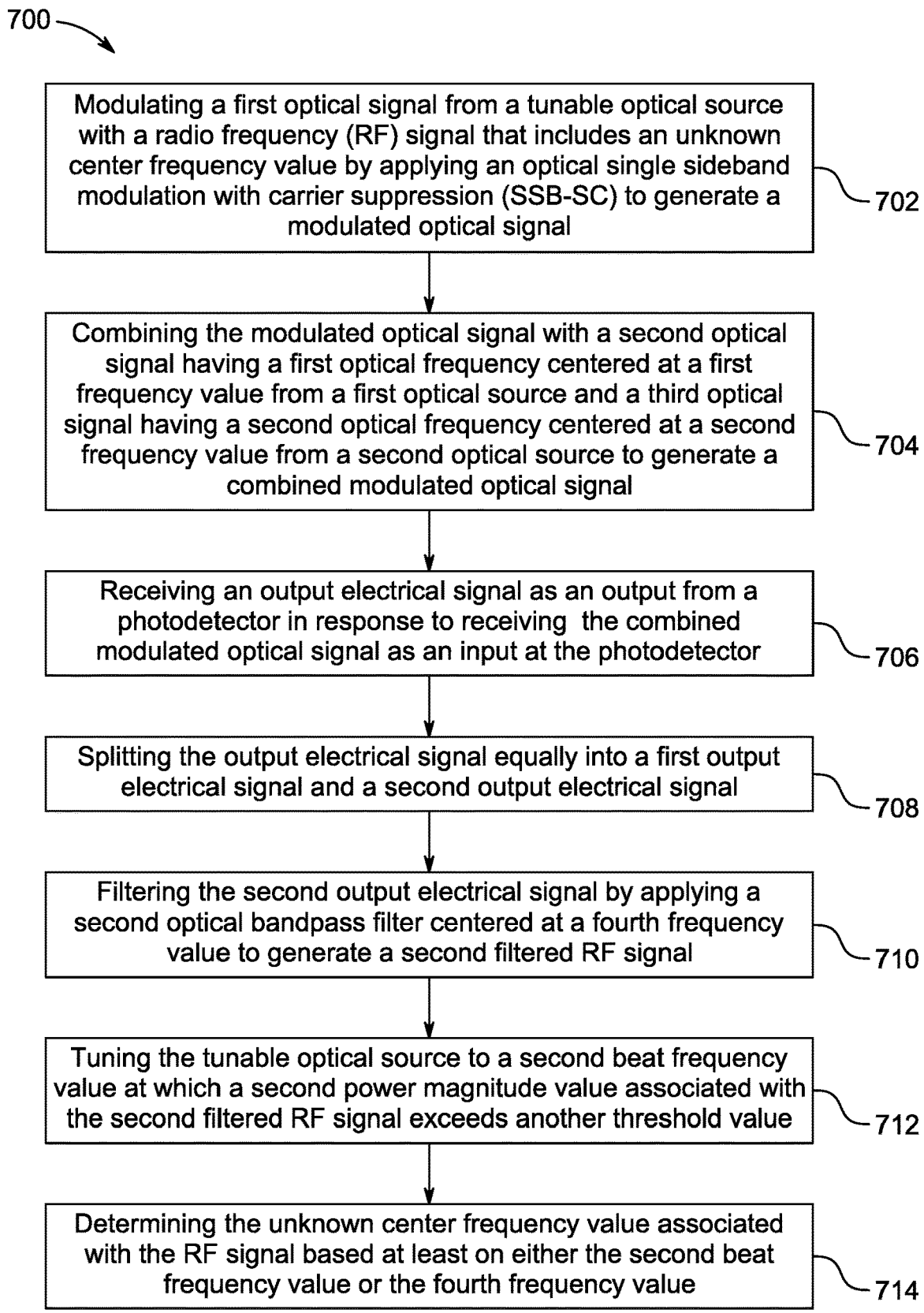
FIG. 7 illustrates another method of determining unknown radio frequencies using photonic signal processing, according to exemplary aspects of the present disclosure.

FIG. 7 illustrates another method 700 of determining unknown radio frequencies using photonic signal processing, according to exemplary aspects of the present disclosure.

At step 702, the method 700 includes modulating the first optical signal 150 from the tunable optical source 102 with a RF signal that includes an unknown center frequency value by applying an optical single sideband modulation with carrier suppression (SSB-SC) to generate a modulated optical signal 152. According to an aspect of the present disclosure, the optical modulator 112 may be configured to modulate the first optical signal 150 from the tunable optical source 102 with the unknown RF signal.

At step 704, the method 700 includes combining the modulated optical signal 152 with a second optical signal 154 having a first optical frequency centered at a first frequency value from the first optical source 104 and a third optical signal 156 having a second optical frequency centered at a second frequency value from the second optical source 106 to generate a combined modulated optical signal 158. According to an aspect of the present disclosure, the optical coupler 114 may be configured to combine the modulated optical signal 152 with the second optical signal 154 and the third optical signal 156 to generate the combined modulated optical signal 158.

At step 706, the method 700 includes receiving an output electrical signal 160 as an output from the photodetector 116 in response to receiving the combined modulated optical signal 158 as an input at the photodetector 116. According to an aspect of the present disclosure, the photodetector 116 may be configured to receive the combined modulated optical signal 158 as an input. Upon receiving the combined modulated optical signal 158, the photodetector 116 may process the combined modulated optical signal 158 and generate an output electrical signal 160 as an output.

At step 708, the method 700 includes splitting the output electrical signal 160 equally into a first output electrical signal 162 and a second output electrical signal 164. According to an aspect of the present disclosure, the optical splitter 118 may be configured to split the output electrical signal 160 equally into the first output electrical signal 162 and the second output electrical signal 164.

At step 710, the method 700 includes filtering the second output electrical signal 164 by applying the second optical bandpass filter 110 centered at a fourth frequency value to generate a second filtered RF signal 168. According to an aspect of the present disclosure, the second optical bandpass filter 110 may filter the second output electrical signal 164 to generate the second filtered RF signal 168.

At step 712, the method 700 includes tuning the tunable optical source 102 to a second beat frequency value at which a second power magnitude value associated with the second filtered RF signal 168 exceeds another threshold value. According to an aspect of the present disclosure, the optical tuner 120 may be configured to tune the tunable optical source 102 to the second beat frequency value at which the second power magnitude value associated with the second filtered RF signal 168 exceeds another threshold value.

At step 714, the method 700 includes determining the unknown center frequency value associated with the RF signal based at least on either the second beat frequency value or the fourth frequency value. According to an aspect of the present disclosure, the frequency calculation unit 122 may be configured to determine the unknown center frequency value associated with the RF signal based at least on either the second beat frequency value or the fourth frequency value.

INDUSTRIAL APPLICABILITY

In an example, the frequency to time mapping technique may involve transmission of a modulated optical signal through a dispersive element. The speed of propagation of the modulated optical signal passing through the dispersive element may be based on the frequency of a modulating radio signal. Based on the difference in time of arrival, the frequencies involved may be measured. For example, two frequencies having a difference of a few GHz (for example, 1 GHz) may exhibit a time deviation of a few picoseconds (for example 25 picoseconds) after passing through the dispersive element. Therefore, an error in the range of hundreds of MHz to GHz (for example, ±1.56 GHz) may be expected when using the frequency to time mapping technique for frequency measurement. Further, the frequency to space mapping technique may involve modulation of an optical signal with an unknown radio signal whose frequency is to be measured. The modulated optical signal may then split into multiple spatial channels using an optical channelizer. Based on the frequency of the unknown radio signal, the optical channelizer may generate multiple outputs. Therefore, the frequency of the unknown radio signal may be determined based upon which output channel it exits from. Also, the frequency to power mapping technique may involve transmission of a modulated optical signal through optical components that may provide different output powers for different modulation frequencies. The measuring bandwidth is limited in the frequency to power mapping technique.

Also, currently the frequency measurement techniques are based on conventional electronics-based techniques such as delay-line based techniques, digital techniques, or electrical filters based techniques. The electronics-based techniques have a high resolution, however they have a narrow range of frequency measurement and high power consumption and are prone to electromagnetic interference.

The present disclosure provides a frequency measurement technique that involves minimum signal processing and does not require any dispersive or delay elements, therefore, enabling it to measure a wide range of radio frequencies in a very short time.

According to an aspect of the present disclosure, the frequency measurement technique employs off-the-shelf optical components to measure a wide range of frequencies ranging from a few MHz to hundreds of GHz. The off-theshelf optical components are connected together in a specific way to develop the apparatus 100, 300. The frequency measurement technique can measure any radio frequency in the surrounding area and the technique does not require manufacturing of specialized components and so can be easily applied. The technique described in the present disclosure involves simple processing and is cost-efficient since no specialized component is required. The technique is based upon ultra-fast optical components, making it suitable for instantaneous measurements. The apparatus 100, 300 is robust and is not affected by environmental conditions. Also, the described frequency measurement technique provides accurate results.

Figure 8:
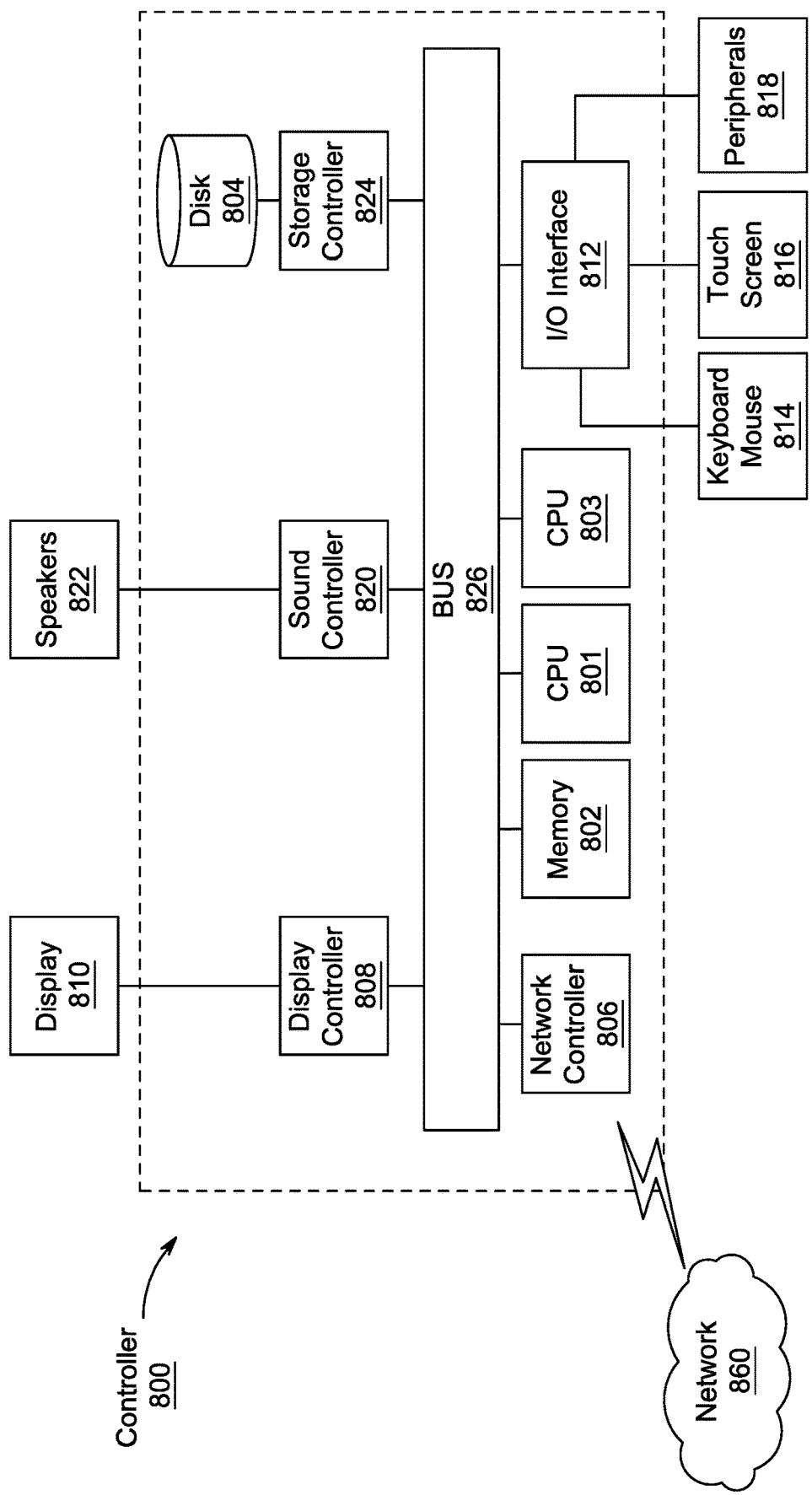
FIG. 8 is an illustration of a non-limiting example of details of computing hardware used in a computing system, according to exemplary aspects of the present disclosure.

FIG. 8 is an illustration of a non-limiting example of details of computing hardware used in the computing system, according to exemplary aspects of the present disclosure. In FIG. 8, a controller 800 is described which is a computing device (for example, the frequency calculation unit 122, 344) and includes a CPU 801 which performs the processes described above/below. The process data and instructions may be stored in memory 802. These processes and instructions may also be stored on a storage medium disk 804 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 801, 803 and an operating system such as Microsoft Windows 7, UNIX, Solaris, LINUX, Apple MAC-OS, and other systems known to those skilled in the art.

The hardware elements in order to achieve the computing device may be realized by various circuitry elements, known to those skilled in the art. For example, CPU 801 or CPU 803 may be a Xenon or Core processor from Intel of America or an Opteron processor from AMD of America, or may be other processor types that would be recognized by one of ordinary skill in the art. Alternatively, the CPU 801, 803 may be implemented on an FPGA, ASIC, PLD or using discrete logic circuits, as one of ordinary skill in the art would recognize. Further, CPU 801, 803 may be implemented as multiple processors cooperatively working in parallel to perform the instructions of the inventive processes described above.

The computing device in FIG. 8 also includes a network controller 806, such as an Intel Ethernet PRO network interface card from Intel Corporation of America, for interfacing with network 860. As can be appreciated, the network 860 can be a public network, such as the Internet, or a private network such as an LAN or WAN network, or any combination thereof and can also include PSTN or ISDN subnetworks. The network 860 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 808, such as a NVIDIA GeForce GTX or Quadro graphics adaptor from NVIDIA Corporation of America for interfacing with display 810, such as a Hewlett Packard HPL2445w LCD monitor. A general purpose I/O interface 812 interfaces with a keyboard and/or mouse 814 as well as a touch screen panel 816 on or separate from display 810. General purpose I/O interface also connects to a variety of peripherals 818 including printers and scanners, such as an OfficeJet or DeskJet from Hewlett Packard.

A sound controller 820 is also provided in the computing device such as Sound Blaster X-Fi Titanium from Creative, to interface with speakers/microphone 822 thereby providing sounds and/or music.

The general-purpose storage controller 824 connects the storage medium disk 804 with communication bus 826, which may be an ISA, EISA, VESA, PCI, or similar, for interconnecting all of the components of the computing device. A description of the general features and functionality of the display 810, keyboard and/or mouse 814, as well as the display controller 808, storage controller 824, network controller 806, sound controller 820, and general purpose I/O interface 812 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 9.

Figure 9:
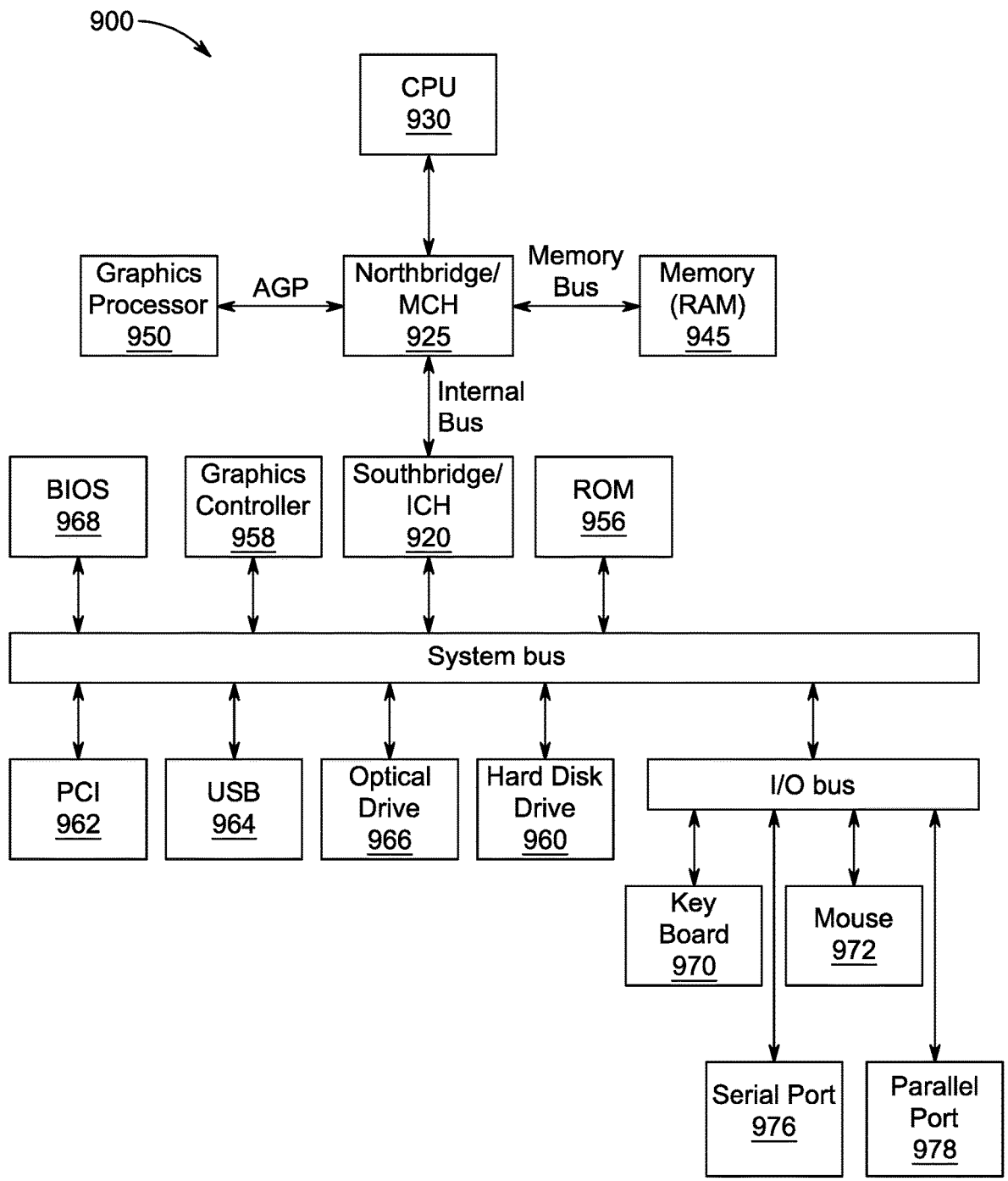
FIG. 9 is an exemplary schematic diagram of a data processing system used within the computing system, according to exemplary aspects of the present disclosure.

FIG. 9 shows a schematic diagram of a data processing system 900 used within the computing system, according to exemplary aspects of the present disclosure. The data processing system 900 is an example of a computer in which code or instructions implementing the processes of the illustrative aspects of the present disclosure may be located.

In FIG. 9, data processing system 980 employs a hub architecture including a north bridge and memory controller hub (NB/MCH) 925 and a south bridge and input/output (I/O) controller hub (SB/ICH) 920. The central processing unit (CPU) 930 is connected to NB/MCH 1025. The NB/MCH 925 also connects to the memory 945 via a memory bus, and connects to the graphics processor 950 via an accelerated graphics port (AGP). The NB/MCH 925 also connects to the SB/ICH 920 via an internal bus (e.g., a unified media interface or a direct media interface). The CPU Processing unit 930 may contain one or more processors and even may be implemented using one or more heterogeneous processor systems.

Figure 10:
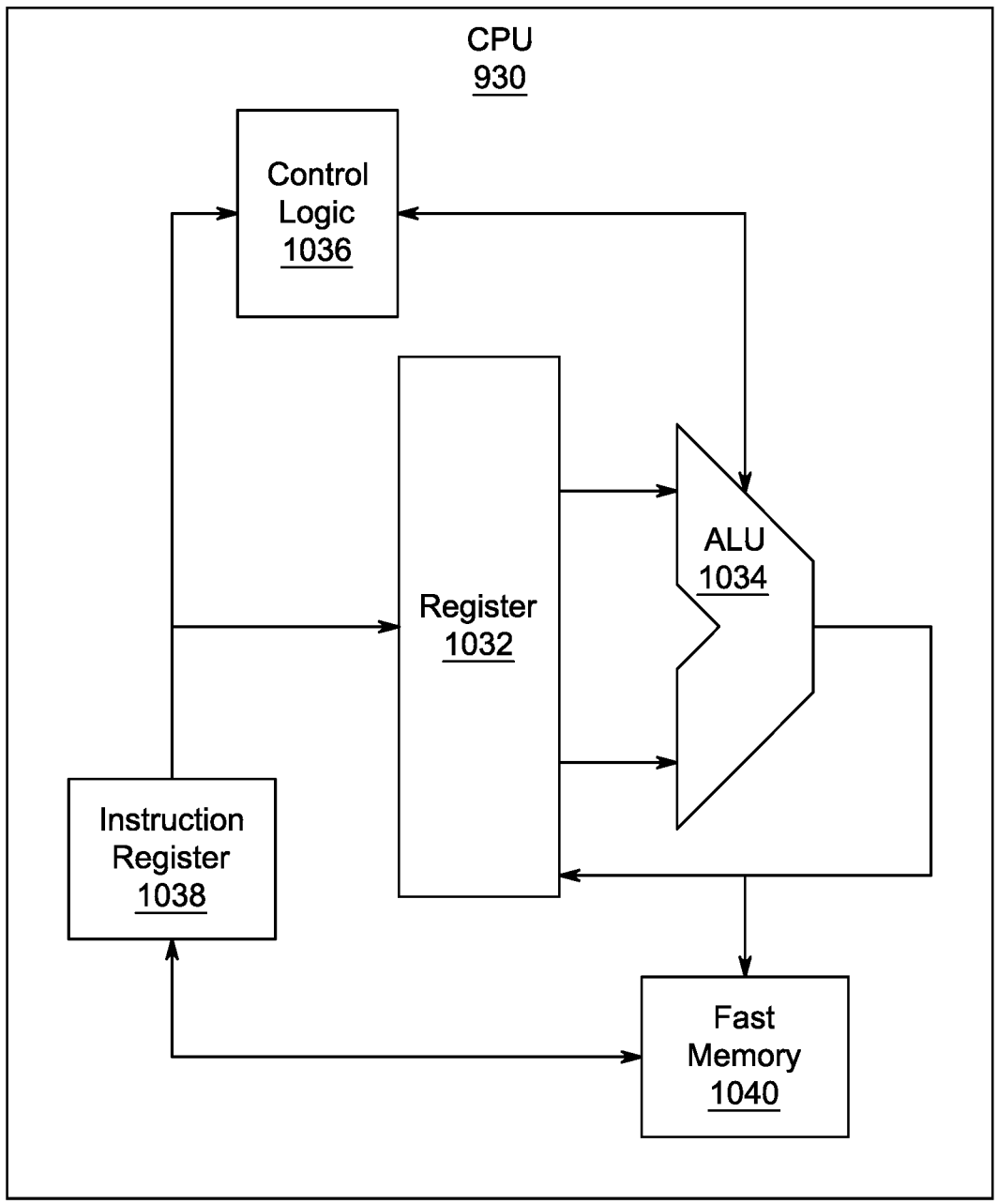
FIG. 10 is an exemplary schematic diagram of a processor used with the computing system, according to exemplary aspects of the present disclosure.

For example, FIG. 10 shows one aspect of the present disclosure of CPU 930. In one aspect of the present disclosure, the instruction register 1038 retrieves instructions from the fast memory 1040. At least part of these instructions is fetched from the instruction register 1038 by the control logic 1036 and interpreted according to the instruction set architecture of the CPU 930. Part of the instructions can also be directed to the register 1032. In one aspect of the present disclosure the instructions are decoded according to a hardwired method, and in other aspects of the present disclosure the instructions are decoded according to a microprogram that translates instructions into sets of CPU configuration signals that are applied sequentially over multiple clock pulses. After fetching and decoding the instructions, the instructions are executed using the arithmetic logic unit (ALU) 1034 that loads values from the register 1032 and performs logical and mathematical operations on the loaded values according to the instructions. The results from these operations can be feedback into the register and/or stored in the fast memory 1040. According to certain aspects of the present disclosures, the instruction set architecture of the CPU 930 can use a reduced instruction set architecture, a complex instruction set architecture, a vector processor architecture, a very large instruction word architecture. Furthermore, the CPU 930 can be based on the Von Neuman model or the Harvard model. The CPU 930 can be a digital signal processor, an FPGA, an ASIC, a PLA, a PLD, or a CPLD. Further, the CPU 930 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 9, the data processing system 980 can include that the SB/ICH 920 is coupled through a system bus to an I/O Bus, a read only memory (ROM) 956, universal serial bus (USB) port 964, a flash binary input/output system (BIOS) 968, and a graphics controller 958. PCI/PCIe devices can also be coupled to SB/ICH 920 through a PCI bus 962.

The PCI devices may include, for example, Ethernet adapters, add-in cards, and PC cards for notebook computers. The Hard disk drive 960 and CD-ROM 956 can use, for example, an integrated drive electronics (IDE) or serial advanced technology attachment (SATA) interface. In one aspect of the present disclosure the I/O bus can include a super I/O (SIO) device.

Further, the hard disk drive (HDD) 960 and optical drive 966 can also be coupled to the SB/ICH 920 through a system bus. In one aspect of the present disclosure, a keyboard 970, a mouse 972, a parallel port 978, and a serial port 976 can be connected to the system bus through the I/O bus. Other peripherals and devices that can be connected to the SB/ICH 920 using a mass storage controller such as SATA or PATA, an Ethernet port, an ISA bus, an LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 11:
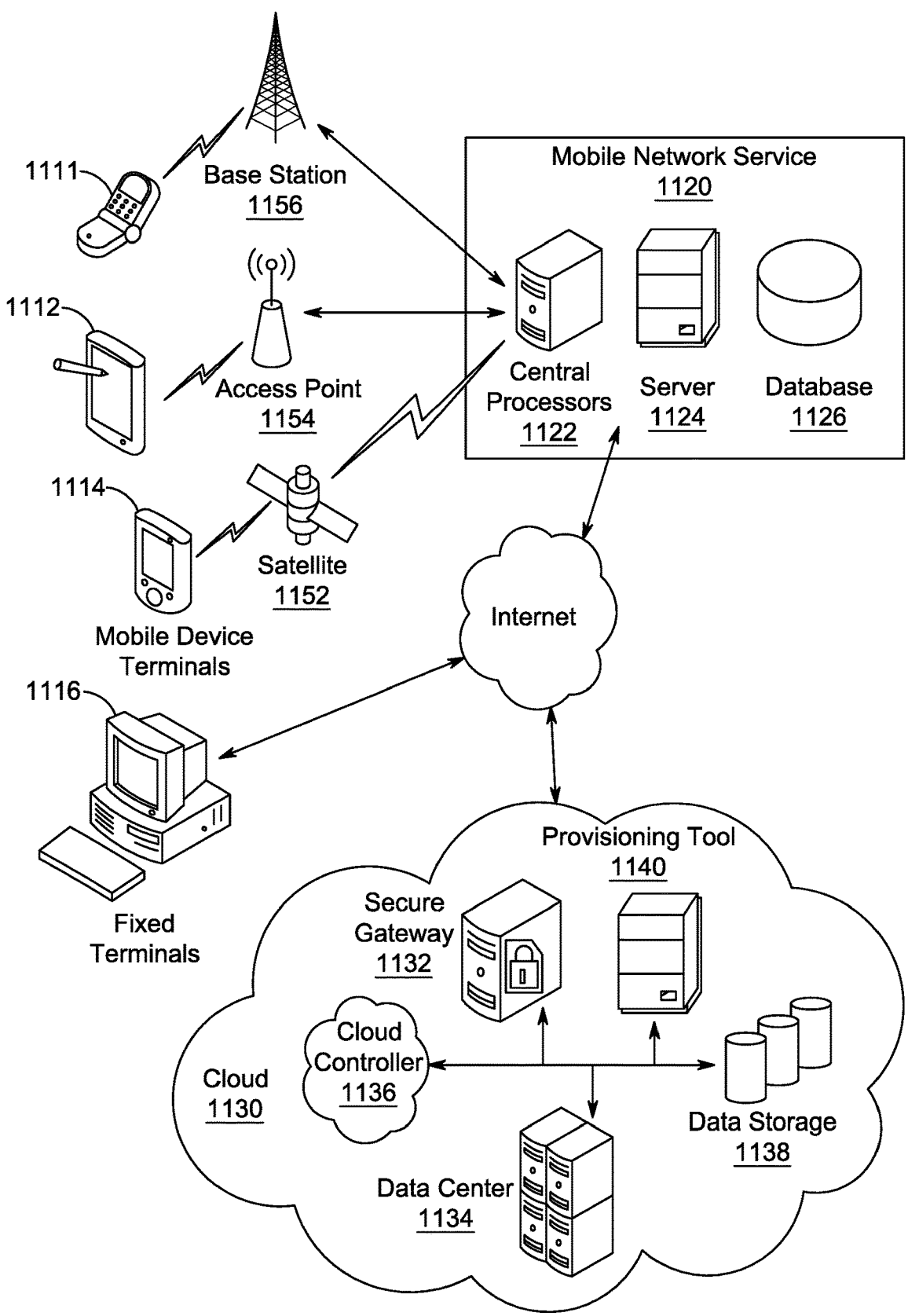
FIG. 11 is an illustration of a non-limiting example of distributed components which may share processing with the controller, according to exemplary aspects of the present disclosure.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 11, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some aspects of the present disclosures may be performed on modules or hardware not identical to those described. Accordingly, other aspects of the present disclosures are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the disclosure may be practiced otherwise than as specifically described herein.

The invention claimed is:

1. A method of determining unknown radio frequencies using photonic signal processing, the method comprising:
   modulating a first optical signal from a tunable optical source with a radio frequency (RF) signal that includes an unknown center frequency value by applying an optical single sideband modulation with carrier suppression (SSB-SC) to generate a modulated optical signal;
   combining the modulated optical signal with a second optical signal with a first optical frequency centered at a first frequency value from a first optical source and a third optical signal with a second optical frequency centered at a second frequency value from a second optical source to generate a combined modulated optical signal;
   receiving an output electrical signal as an output from a photodetector in response to receiving the combined modulated optical signal as an input at the photodetector;
   splitting the output electrical signal equally into a first output electrical signal and a second output electrical signal;
   filtering the first output electrical signal by applying a first optical bandpass filter centered at a third frequency value to generate a first filtered RF signal;
   tuning the tunable optical source to a first beat frequency value at which a first power magnitude value associated with the first filtered RF signal exceeds a threshold value; and
   determining the unknown center frequency value associated with the RF signal based at least on the first beat frequency value.

2. The method of claim 1, further comprising:
   filtering the second output electrical signal by applying a second optical bandpass filter centered at a fourth frequency value to generate a second filtered RF signal;
   tuning the tunable optical source to a second beat frequency value at which a second power magnitude value associated with the second filtered RF signal exceeds another threshold value; and
   determining the unknown center frequency value associated with the RF signal based at least on the second beat frequency value.

3. The method of claim 1, wherein the first power magnitude value associated with the first filtered RF signal exceeds the threshold value when an upper side band of the first filtered RF signal is at a first predetermined frequency difference value from the first frequency value and at a second predetermined frequency difference value from the second frequency value.

4. The method of claim 3, wherein the first predetermined frequency difference value is 5 GHz and the second predetermined frequency difference value is 10 GHz.

5. The method of claim 2, wherein the second power magnitude value associated with the second filtered RF signal exceeds the other threshold value when an upper side band of the first filtered RF signal is at a first predetermined frequency difference value from the first frequency value and at a second predetermined frequency difference value from the second frequency value.

6. The method of claim 5, wherein the first predetermined frequency difference value is 10 GHz and the second predetermined frequency difference value is 5 GHz.

7. The method of claim 1, wherein the tunable optical source is a tunable laser source.

8. The method of claim 7, wherein the tunable laser source has an output power of 10 MHz and the first frequency value is 193.1 THz and the second frequency value is 193.115 THz.

9. The method of claim 1, wherein the photodetector has a responsivity of 0.9 ampere/watt A/W and a bandwidth of 20 GHz.

10. The method of claim 1, wherein the third frequency value is 5 GHz and the fourth frequency value is 10 GHz.

11. An apparatus for determining unknown radio frequencies using photonic signal processing, the apparatus comprising a memory with programmed instructions stored thereon and one or more processors configured to execute the stored programmed instructions to:
modulate a first optical signal from a tunable optical source with a radio frequency (RF) signal that includes an unknown center frequency value by applying an optical single sideband modulation with carrier suppression (SSB-SC) to generate a modulated optical signal;
combine the modulated optical signal with a second optical signal with a first optical frequency centered at a first frequency value from a first optical source and a third optical signal with a second optical frequency centered at a second frequency value from a second optical source to generate a combined modulated optical signal;
receive an output electrical signal as an output from a photodetector in response to receiving the combined modulated optical signal as an input at the photodetector;
split the output electrical signal equally into a first output electrical signal and a second output electrical signal;
filter the first output electrical signal by applying a first optical bandpass filter centered at a third frequency value to generate a first filtered RF signal;
tune the tunable optical source to a first beat frequency value at which a first power magnitude value associated with the first filtered RF signal exceeds a threshold value;
determine the unknown center frequency value associated with the RF signal based at least on either the first beat frequency value or a second beat frequency value.

12. The apparatus of claim 11, further configured to:
filter the second output electrical signal by applying a second optical bandpass filter centered at a fourth frequency value to generate a second filtered RF signal;
tune the tunable optical source to the second beat frequency value at which a second power magnitude value associated with the second filtered RF signal exceeds another threshold value; and
determine the unknown center frequency value associated with the RF signal based at least on the second beat frequency value.

13. The apparatus of claim 11, further configured to:
determine the unknown center frequency value associated with the RF signal based at least on either the first beat frequency value or the third frequency value.

14. The apparatus of claim 11, wherein the first power magnitude value associated with the first filtered RF signal exceeds the threshold value when an upper side band of the first filtered RF signal is at a first predetermined frequency difference value from the first frequency value and at a second predetermined frequency difference value from the second frequency value.

15. The apparatus of claim 14, wherein the first predetermined frequency difference value is 5 GHz and the second predetermined frequency difference value is 10 GHz.

16. The apparatus of claim 12, wherein the second power magnitude value associated with the second filtered RF signal exceeds the other threshold value when an upper side band of the first filtered RF signal is at a first predetermined frequency difference value from the first frequency value and at a second predetermined frequency difference value from the second frequency value.

17. The apparatus of claim 16, wherein the first predetermined frequency difference value is 10 GHz and the second predetermined frequency difference value is 5 GHz.

18. The apparatus of claim 11, wherein the tunable optical source is a tunable laser source.

19. The apparatus of claim 18, wherein the tunable laser source has an output power of 10 MHz and the first frequency value is 193.1 THz and the second frequency value is 193.115 THz.

* * * * *